United States Patent [19]
Cox

[11] Patent Number: 5,438,693
[45] Date of Patent: Aug. 1, 1995

[54] R. F. MIXER

[75] Inventor: Ian F. Cox, Old Harlow, United Kingdom

[73] Assignee: GEC-Marconi Limited, Middlesex, United Kingdom

[21] Appl. No.: 338,792

[22] Filed: Nov. 8, 1994

Related U.S. Application Data

[63] Continuation of Ser. No. 992,638, Dec. 18, 1992, abandoned.

[30] Foreign Application Priority Data

Dec. 24, 1991 [GB] United Kingdom ............... 9127359

[51] Int. Cl.$^6$ .............................................. H04B 1/28
[52] U.S. Cl. .................................. 455/333; 455/326; 327/355; 327/484
[58] Field of Search ............... 455/323, 325, 326, 330, 455/333, 318, 319, 320; 307/255, 355, 494, 529; 327/355, 484

[56] References Cited

U.S. PATENT DOCUMENTS 3,705,355 12/1972 Palmer et al. .................. 455/333

FOREIGN PATENT DOCUMENTS 2099250 12/1982 United Kingdom .

OTHER PUBLICATIONS

Electronic Engineering, May, 1986; "High Dynamic Range Mixing With the Si9801", Oxner, pp. 53–56.
I.E.E.E. Transactions on Circuits and Systems, vol. 35, No. 2, Feb., 1988; "High-Speed Driver For Switching Power MOSFET's", Kazimierczuk, pp. 254–256.
"A transistor Switch" A. I Efremor et al Dec. 23, 1972.
Oxner, "FETs In Balanced Mixers" Siliconix, Inc, Jul. 1972.

*Primary Examiner*—Reinhard J. Eisenzopf
*Assistant Examiner*—Thanh Le
*Attorney, Agent, or Firm*—Spencer, Frank & Schneider

[57] ABSTRACT

A mixer of the commutating type using FETs to switch between the primary of a transformer for an r.f. input and the secondary of a transformer 2 for an i.f. output. The mixer has high linearity and low power consumption of the local oscillator drive because the gate electrodes of the FETs are switched using pulse waveforms from driving transistors.

8 Claims, 2 Drawing Sheets

R. F. MIXER

This application is a continuation of application Ser. No. 07/992,638, filed Dec. 18, 1992, now abandoned.

BACKGROUND OF THE INVENTION

This invention relates to r.f. mixers, i.e. for frequency-changing an input signal.

The invention is particularly concerned with mixers using FET switching devices for connecting the input and output, e.g. FETs arranged in a double balanced, i.e. bridge form.

The alternate reversing of the connections between the input and the output may be effected by driving the gate electrodes of the FETs in each pair of opposite branches in anti-phase at a local oscillator frequency.

In order to obtain high linearity in the mixer performance, the FETs must be switched as rapidly as possible, and this implies using a square wave to drive the gate electrodes.

A transformer has been used to provide such a drive, but a square wave requires a broad bandwidth if the rise and fall times are to be rapid. This can only be achieved if the transformer is terminated in a low impedance but, since the output impedance of the gates is capacitive, this requires a defined low resistance shunted across the output of the transformer drive, which would dissipate power.

One way in which a low power drive input to the FETs has been achieved is by employing a resonant circuit of which the capacitances of the FETs form a part (Electronic Engineering, May 1986, Ed Oxner, "High Dynamic Range mixing with the Si 8901", pages 53–56), but then a square wave drive could not be used.

SUMMARY OF THE INVENTION

The invention provides a mixer for frequency changing an r.f. input to produce an output at a different frequency, comprising a pair of insulated gate FET switching devices for connecting the input to the output and a drive circuit for producing pulse waveforms for repetitively charging and discharging the capacitance of the FET gates to switch the FET switching devices on and off at a local oscillator frequency.

The pulse waveforms permit rapid switching of the FETs (and hence high linearity) and low power consumption.

The drive circuit may include a pair of transistors for switching different potentials e.g. alternately positive and negative potentials, to the FET gates, and the pulse nature of the waveforms enables rapid switching to take place, since each transistor has time to come out of saturation after each pulse and does not dissipate part of the next pulse from the other transistor in the cancellation of stored charge.

The transistors may be a complementary pair and may be driven from their bases via respective capacitor from a square wave local oscillator drive.

BRIEF DESCRIPTION OF THE DRAWINGS

An r.f. mixer constructed in accordance with the invention will now be described by way of example with reference to the accompanying drawings, in which.

DESCRIPTION OF THE PREFERRED EMBODIMENT

Figure 1:
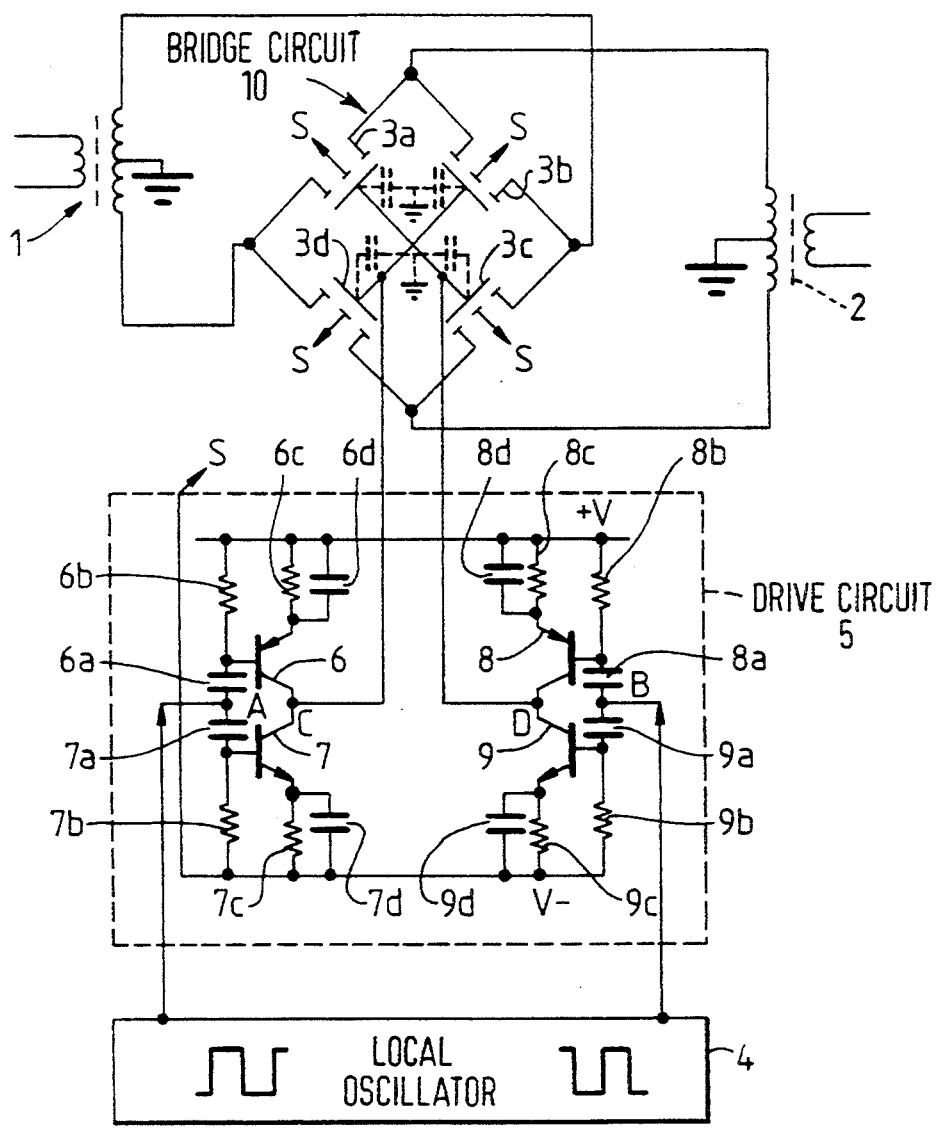
FIG. 1 is a circuit diagram of the mixer.

The mixer includes a transformer 1 having an r.f. input applied to the primary and a transformer 2 having an i.f. output obtained from the secondary. The secondary of transformer 1 and the primary of transformer 2 are both center tapped to ground and the ends of the windings are connected to opposite points of a bridge 10 of four MOSFETs 3a, 3b, 3c, 3d. The gates of FETs 3a, 3c and 3b, 3d in opposite arms are connected together and driven in antiphase so that MOSFETs 3a and 3c conduct together in alternation with MOSFETs 3b and 3d. A local oscillator 4 feeds square wave oscillations in antiphase with respect to each other to points A and B of MOSFET drive circuit 5, in which the signals are amplified.

The drive circuit 5 has positive and negative rails +V and −V between which are connected two pairs 6, 7; 8, 9 of complementary n-p-n, p-n-p, transistors. The bases of these transistors are driven by the antiphase local oscillator drive waveforms via respective capacitors 6a, 7a, 8a and 9a. Respective bias components 6b–6d, 7b–7d, 8b–8d and 9b–9d are also provided. The negative rail −V is also connected to the substrates s of all the MOSFETs.

Figure 2:
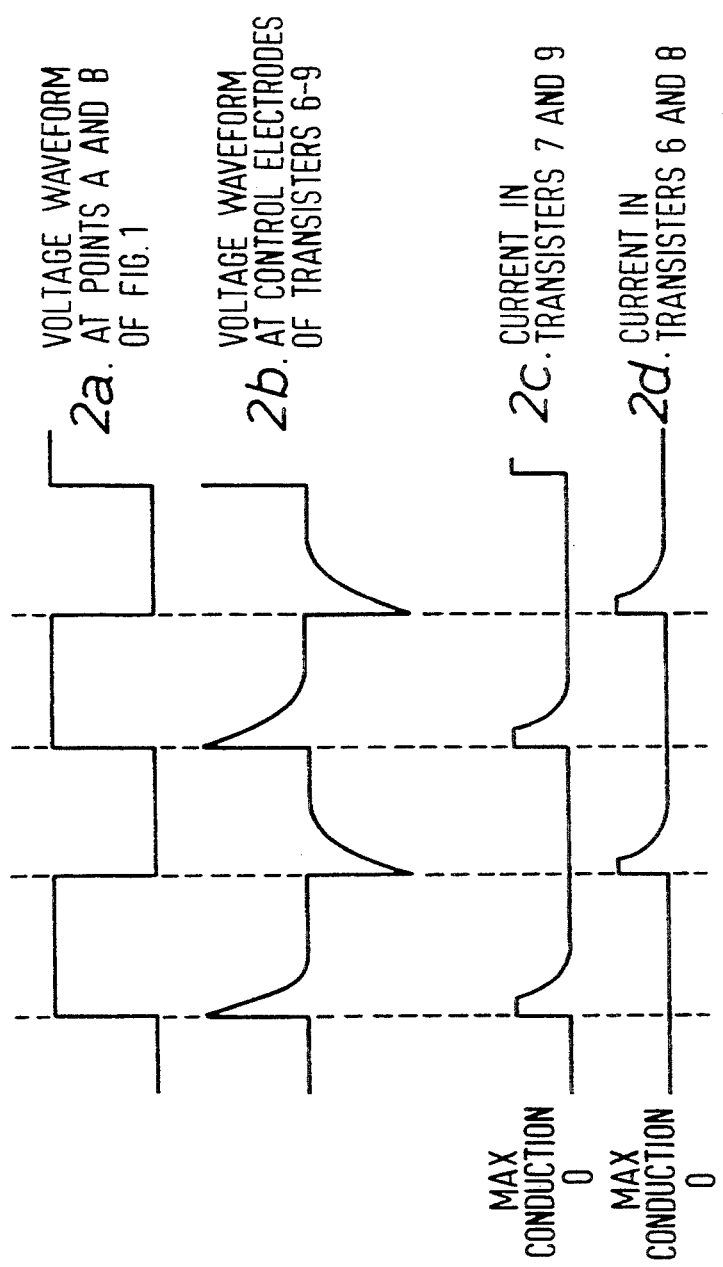
FIG. 2 shows waveforms at various points in the circuit.

Referring to FIG. 2, the voltage waveforms at both points A and B are of the form shown in FIG. 2a (but in antiphase). After differentiation by the capacitors 9a–9a and resistors 6B–6b, the voltage waveforms appearing at the bases or control electrodes of the transistors 6 to 9 are of the form shown in FIG. 2b but in antiphase at 8,9 compared to 6,7. The effect of these base voltages is to repetitively switch on the n-p-n transistors 7, 9 when a positive spike appears at the base, as shown in FIG. 2c, and the p-n-p transistors 6, 8 when a negative spike appears at the base, as shown in FIG. 2d. FIGS. 2c and 2d show the conduction of the transistors as a percentage of full conduction i.e. saturation The effect of this, in view of the antiphase drive waveforms, is that either transistors 6,9 are driven on with 7,8 off, or transistors 7,8 are driven on with 6,9 off.

When transistor 6 is switched on the gate electrodes of FETs 3a and 3c are positive with respect to the channel and the FETs 3c to 3d are rapidly switched on. At the same time, the antiphase waveform switches transistor 9 on, turning FETs 3a and 3c off. On the next half cycle, transistors 7 and 8 are switched on, reversing the status of the FETs The relatively large current through the transistors only has to charge the gate capacitance of the FETs and the rise time is accordingly rapid. Due to the spike nature of the waveform applied to the base of the transistors, they switch off relatively quickly. For example, by the time that the negative spike shown in FIG. 2b is developed at the bases of transistors 6 and 7, transistor 7 is no longer in saturation so that transistor 6 saturates rapidly.

The switch-on of the FETs is rapid, promoting linearity of the mixer, because a large current flows to the gate electrode from the transistors and because each transistor of the pairs 6,7 and 8, 9 has ceased to be in saturation by the time the other transistor of the pairs 6,7 and 8,9 switches on. Were this not the case, part of the current developed at switch-on of each transistor would have to cancel stored charge in the other transistor, delaying the rise time of the current pulse. The pulse nature of the waveform also results in low power consumption of the local oscillator drive circuit.

The positive and negative rails may be +10 V, and the mixer is suitable for any r.f. signal, particularly HF (3–30 MHz) signals. The local oscillator signal may be up to 250 MHz. These parameters may vary depending on the characteristics of the devices used.

Of course other variations may be made without departing from the scope of the invention. Thus, the matched pair of transistors 6, 7 and 8, 9 may be replaced by FETs, and while the MOSFETs are p-channel insulated gate enhancement type semiconductor devices, n-channel MOSFETs may be used and insulated gate FETs of the depletion type may be used, or any other type of FET may be used. Also, while a double balanced form of mixer has been described, the invention is also applicable to a single balanced form. Furthermore, transmission-line style transformers may be used in place of the conventional transformers 1, 2 shown.

I claim:

1. A mixer for changing the frequency of an r.f. signal applied to an input means to an output signal of a different frequency at an output means, comprising
   a pair of insulated gate FET switching devices each having a gate electrode with an associated capacitance, said switching devices connecting the input means to the output means;
   a local oscillator for generating antiphase signals at a predetermined frequency; and
   a drive circuit for generating pulse waveforms in response to said antiphase signals to drive said gate electrodes, the duration of the pulse waveforms being shorter than the duration of a half-cycle of the local oscillator, said drive circuit including
   a pair of transistors, associated with each switching device, each transistor including a control electrode and an output electrode, the output electrodes of said pair being coupled to the gate electrode of said associated switching device; and
   a differentiating circuit, associated with each transistor, each comprising a series capacitor coupled at one end to said local oscillator and at the other end both to the control electrode of said associated transistor and to one end of a resistive means, the other end of said resistive means being coupled to a reference potential, the pulse waveforms generated by said drive circuit repetitively charging and discharging the capacitance of the gate electrodes of said switching devices between different potentials to switch said switching devices on and off at the frequency of said local oscillator.

2. A mixer as claimed in claim 1, in which the pair of transistors form a complementary pair.

3. A mixer as claimed in claim 1, in which the insulated gate FET switching devices are MOSFETs.

4. A mixer for frequency changing an r.f. input voltage having a first frequency to an output voltage having a second frequency, comprising:
   first and second terminals for receiving said r.f. input voltage, and third and fourth terminals for receiving said output voltage;
   first, second, third and fourth FET switching devices connected in a bridge circuit, each of said switching devices including a gate electrode with an associated capacitance;
   first means connecting a junction of said first and fourth switching devices to said first terminal, and second means connecting a junction of said second and third switching devices to said second terminal;
   third means connecting a junction of said first and second switching devices to said third terminal, and fourth means connecting a junction of said third and fourth switching devices to said fourth terminal;
   a local oscillator having first and second output terminals for generating at said output terminals antiphase voltages at a predetermined frequency;
   a drive circuit for generating pulse waveforms in response to said antiphase signals to drive said gate electrodes, the duration of the pulse waveforms being shorter than the duration of a half-cycle of the local oscillator, said drive circuit, including
   first, second, third and fourth transistors, each of said transistors having first, second and third electrodes, the first electrodes of said first and third transistors being coupled to a first voltage source having a first polarity and the first electrodes of said second and fourth transistors being coupled to a second voltage source having a second polarity, the third electrodes of said first and second transistors being connected to the gate electrodes of said second and fourth FET switching devices and the third electrodes of said third and fourth transistors being connected to the gate electrodes of said first and third FET switching devices; and
   first and second differentiator means, said first differentiator means being interposed between the second electrodes of said first and second transistors and the first output terminal of said local oscillator, and said second differentiator means being interposed between the second electrodes of said third and fourth transistors and the second output terminal of said local oscillator, whereby the first and second antiphase voltages generated at the output terminals of said local oscillator repetitively charge and discharge the capacitances of the gate electrodes of said FET switching devices to switch said switching devices on and off at the predetermined frequency of said local oscillator.

5. A mixer according to claim 4 wherein said first differentiator means includes first and second capacitors interposed between the second electrodes of said first and second transistors respectively and the first output terminal of said local oscillator, and first and second resistors coupled between the second electrodes of said first and second transistors and said first and second voltage sources respectively, and said second differentiator means includes third and fourth capacitors interposed between the second electrodes of said third and fourth transistors respectively and the second output terminal of said local oscillator, and third and fourth resistors coupled between the second electrodes of said third and fourth transistors and said first and second voltage sources respectively.

6. A mixer according to claim 4, wherein the FET switching devices are MOSFETs.

7. A mixer according to claim 4, wherein the first, second and third electrodes of each of said transistors are emitter, collector and base electrodes respectively.

8. A mixer according to claim 7 wherein said first and third transistors are PNP transistors, and said second and fourth transistors are NPN transistors.

* * * * *